(12) United States Patent
Reier et al.

(10) Patent No.: US 9,890,940 B2
(45) Date of Patent: Feb. 13, 2018

(54) LED BOARD WITH PERIPHERAL THERMAL CONTACT

(71) Applicant: Cree, Inc., Durham, NC (US)

(72) Inventors: Bart P. Reier, Cary, NC (US); Curt Progl, Raleigh, NC (US); Daniel J. Van Epps, Jr., Apex, NC (US); John R. Rowlette, Jr., Raleigh, NC (US); John Adam Edmond, Durham, NC (US); Kurt Wilcox, Libertyville, IL (US); David Power, Morrisville, NC (US)

(73) Assignee: Cree, Inc., Durham, NC (US)

( * ) Notice: Subject to any disclaimer, the term of this patent is extended or adjusted under 35 U.S.C. 154(b) by 86 days.

(21) Appl. No.: 14/725,936

(22) Filed: May 29, 2015

(65) Prior Publication Data

US 2016/0348884 A1 Dec. 1, 2016

(51) Int. Cl.
| | | |
|---|---|---|
| F21V 29/00 | (2015.01) | |
| F21V 19/00 | (2006.01) | |
| H05K 1/05 | (2006.01) | |
| F21V 29/70 | (2015.01) | |
| F21K 9/237 | (2016.01) | |
| F21K 9/232 | (2016.01) | |
| H05K 1/02 | (2006.01) | |
| F21Y 115/10 | (2016.01) | |
| F21Y 115/15 | (2016.01) | |
| F21Y 113/17 | (2016.01) | |

(52) U.S. Cl.
CPC .............. *F21V 29/70* (2015.01); *F21K 9/232* (2016.08); *F21K 9/237* (2016.08); *F21V 19/003* (2013.01); *F21Y 2113/17* (2016.08); *F21Y 2115/10* (2016.08); *F21Y 2115/15* (2016.08); *H05K 1/0209* (2013.01); *H05K 2201/066* (2013.01); *H05K 2201/10106* (2013.01)

(58) Field of Classification Search
CPC .......... F21V 29/70; F21V 19/003; F21K 9/30; F21K 9/232; F21K 9/237; F21Y 2101/02; F21Y 2105/001; F21Y 2113/17; F21Y 2115/15; H05K 1/0209; H05K 2201/066
See application file for complete search history.

(56) References Cited

U.S. PATENT DOCUMENTS

| | | | |
|---|---|---|---|
| 3,581,162 A | 5/1971 | Wheatley | |
| 4,141,062 A * | 2/1979 | Trueblood | .............. F21L 14/02 362/186 |

(Continued)

FOREIGN PATENT DOCUMENTS

| | | |
|---|---|---|
| EP | 1058221 A2 | 12/2000 |
| EP | 0890059 B1 | 6/2004 |

(Continued)

OTHER PUBLICATIONS

U.S. Appl. No. 62/130,680, filed Mar. 10, 2015.

*Primary Examiner* — Alan Cariaso
(74) *Attorney, Agent, or Firm* — Dennis J. Williamson; Moore & Van Allen PLLC

(57) ABSTRACT

A LED fixture is provided, the lamp comprising a LED board having a thermally conductive periphery, the LED board comprising at least one LED operable to emit light when energized through an electrical path from a base; and a heat sink assembly thermally coupled to the thermally conductive periphery.

39 Claims, 7 Drawing Sheets

(56) References Cited

U.S. PATENT DOCUMENTS

| | | | |
|---|---|---|---|
| 4,353,592 A * | 10/1982 | Cziptschirsch | B60J 3/0282 296/97.5 |
| 5,463,280 A | 10/1995 | Johnson | |
| 5,561,346 A | 10/1996 | Byrne | |
| 5,585,783 A | 12/1996 | Hall | |
| 5,655,830 A | 8/1997 | Ruskouski | |
| 5,688,042 A | 11/1997 | Madadi et al. | |
| 5,806,965 A | 9/1998 | Deese | |
| 5,947,588 A | 9/1999 | Huang | |
| 5,949,347 A | 9/1999 | Wu | |
| 6,220,722 B1 | 4/2001 | Begemann | |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,276,822 B1 | 8/2001 | Bedrosian et al. | |
| 6,465,961 B1 | 10/2002 | Cao | |
| 6,523,978 B1 | 2/2003 | Huang | |
| 6,550,953 B1 | 4/2003 | Ichikawa et al. | |
| 6,634,770 B2 | 10/2003 | Cao | |
| 6,659,632 B2 | 12/2003 | Chen | |
| 6,709,132 B2 | 3/2004 | Ishibashi | |
| 6,803,607 B1 | 10/2004 | Chan et al. | |
| 6,848,819 B1 | 2/2005 | Arndt et al. | |
| 6,864,513 B2 | 3/2005 | Lin et al. | |
| 6,948,829 B2 | 9/2005 | Verdes et al. | |
| 6,982,518 B2 | 1/2006 | Chou et al. | |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,144,135 B2 | 12/2006 | Martin et al. | |
| 7,165,866 B2 | 1/2007 | Li | |
| 7,172,314 B2 | 2/2007 | Currie et al. | |
| 7,213,940 B1 | 5/2007 | Van De Ven et al. | |
| 7,354,174 B1 | 4/2008 | Yan | |
| 7,396,142 B2 | 7/2008 | Laizure, Jr. et al. | |
| 7,600,882 B1 | 10/2009 | Morejon et al. | |
| 7,726,836 B2 | 6/2010 | Chen | |
| 7,758,223 B2 * | 7/2010 | Osawa | F21V 3/00 362/240 |
| 7,824,065 B2 | 11/2010 | Maxik | |
| 7,965,023 B1 | 7/2011 | Liang | |
| 8,021,025 B2 | 9/2011 | Lee | |
| 8,154,181 B1 | 4/2012 | Lin et al. | |
| 8,198,819 B2 | 6/2012 | Lenk | |
| 8,253,316 B2 | 8/2012 | Sun et al. | |
| 8,272,762 B2 | 9/2012 | Maxik et al. | |
| 8,274,241 B2 | 9/2012 | Guest et al. | |
| 8,277,082 B2 | 10/2012 | Dassanayake et al. | |
| 8,282,249 B2 | 10/2012 | Liang et al. | |
| 8,282,250 B1 | 10/2012 | Dassanayake et al. | |
| 8,292,468 B2 | 10/2012 | Narendran et al. | |
| 8,322,896 B2 | 12/2012 | Falicoff et al. | |
| 8,371,722 B2 | 2/2013 | Carroll | |
| 8,400,051 B2 | 3/2013 | Hakata et al. | |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,421,329 B2 | 4/2013 | Liang et al. | |
| 8,427,037 B2 | 4/2013 | Liang et al. | |
| 8,449,154 B2 | 5/2013 | Uemoto et al. | |
| 8,502,468 B2 | 8/2013 | Li et al. | |
| 8,556,465 B2 | 10/2013 | Lee et al. | |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 9,028,103 B2 * | 5/2015 | Lee | F21K 9/135 362/294 |
| 9,052,104 B2 * | 6/2015 | Watanabe | B29C 45/14467 |
| 9,097,416 B2 * | 8/2015 | Van De Moesdijk | F21V 29/004 |
| 9,447,957 B2 * | 9/2016 | Choi | F21V 29/004 |
| 2004/0201990 A1 | 10/2004 | Meyer | |
| 2009/0184618 A1 | 7/2009 | Hakata et al. | |
| 2012/0040585 A1 | 2/2012 | Huang | |
| 2013/0020941 A1 * | 1/2013 | Breidenassel | F21V 23/005 315/113 |
| 2013/0163247 A1 * | 6/2013 | Lee | F21V 29/004 362/249.01 |
| 2013/0271998 A1 * | 10/2013 | Merschon | F21V 7/0058 362/294 |
| 2014/0092596 A1 * | 4/2014 | Deutsch | F21S 4/28 362/236 |
| 2015/0003082 A1 * | 1/2015 | Zhou | F21K 9/90 362/373 |
| 2017/0018697 A1 * | 1/2017 | Konishi | H05K 1/053 |

FOREIGN PATENT DOCUMENTS

| | | |
|---|---|---|
| GB | 2345954 A | 7/2000 |
| JP | H09265807 A | 10/1997 |
| JP | 2000173304 A | 6/2000 |
| JP | 2001118403 A | 4/2001 |
| WO | 0124583 A1 | 4/2001 |
| WO | 0160119 A2 | 8/2001 |
| WO | 2012011279 A1 | 1/2012 |
| WO | 2012031533 A1 | 3/2012 |

* cited by examiner

LED BOARD WITH PERIPHERAL THERMAL CONTACT

TECHNICAL FIELD

An LED lighting system comprising a LED board having a thermally conductive periphery, the LED board comprising at least one LED operable to emit light when energized through an electrical path from a base; and a heat sink assembly thermally coupled to the thermally conductive periphery. A method of heat management for an LED lamp is also provided.

BACKGROUND

Light emitting diode (LED) lighting systems are becoming more prevalent as replacements for older lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting system may take the form of a lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and/or the LEDs in the lamp.

Since, ideally, an LED lamp designed as a replacement for a traditional incandescent or fluorescent light source needs to be self-contained; a power supply may be included in the lamp structure along with the LEDs or LED packages and the optical components. A heat sink is also often needed to cool the LEDs and/or power supply in order to maintain appropriate operating temperature.

SUMMARY OF THE DISCLOSURE

In some embodiments, a LED lighting fixture is provided comprising: a LED board having a thermally conductive periphery, the LED board comprising at least one LED operable to emit light when energized through an electrical path from a base; and a heat sink assembly thermally coupled to the thermally conductive periphery.

In some embodiments, the LED board has a top surface and an opposed bottom surface separated by a conductive layer, the LED board comprising the at least one LED on the top surface and thermally coupled to the conductive layer. In another aspect, alone or in combination with any one of the previous aspects, at least a portion of the bottom surface is thermally insulated.

In some embodiments, alone or in combination with any one of the previous aspects, the LED board has a top surface and an opposed bottom surface separated by a conductive layer, the LED board comprising the at least one LED on the top surface and thermally coupled to the conductive layer, at least a portion of the bottom surface is thermally insulated, wherein the bottom surface comprises a bottom periphery portion not thermally insulated that is thermally coupled to the conductive layer and the heat sink assembly.

In some embodiments, alone or in combination with any one of the previous aspects, the LED board has a top surface and an opposed bottom surface separated by a conductive layer, the LED board comprising the at least one LED on the top surface and thermally coupled to the conductive layer, at least a portion of the bottom surface is thermally insulated, and wherein the top surface comprises a top periphery portion is thermally coupled to the heat sink assembly.

In some embodiments, alone or in combination with any one of the previous aspects, the LED board is substantially planar. In another aspect, alone or in combination with any one of the previous aspects, the LED board has a thermally conductive peripheral edge thermally coupled to the thermally conductive layer. In another aspect, alone or in combination with any one of the previous aspects, the LED board has an odd number of peripheral edges. In another aspect, alone or in combination with any one of the previous aspects, the LED board is substantially triangular shaped or is substantially circular shaped. In another aspect, alone or in combination with any one of the previous aspects, the LED board is a metal core PCB with a metal-exposed peripheral edge.

In some embodiments, alone or in combination with any one of the previous aspects, the heat sink assembly comprises a portion extending into at least a portion of an interior space of the base. In another aspect, alone or in combination with any one of the previous aspects, the heat sink assembly is cup shaped. In another aspect, alone or in combination with any one of the previous aspects, a portion of the heat sink assembly is insert molded with the base. In another aspect, alone or in combination with any one of the previous aspects, the LED board is configured for compression or swage fit to the base. In another aspect, alone or in combination with any one of the previous aspects, at least a portion of the base is of conductive plastic.

In some embodiments, alone or in combination with any one of the previous aspects, the fixture further comprises an optically transmissive exterior enclosure extending from an open end of the base. In another aspect, alone or in combination with any one of the previous aspects, at least a portion of the optically transmissive exterior enclosure is of conductive plastic. In another aspect, alone or in combination with any one of the previous aspects, the heat sink assembly comprises a portion extending into at least a portion of the optically transmissive exterior enclosure.

In some embodiments a heat management method for a LED lighting fixture is provided, the method comprising: providing a heat sink assembly thermally coupled to a LED board having a thermally conductive periphery; directing heat from at least one energized LED to the thermally conductive periphery; and transferring heat from the thermally conductive periphery to the heat sink assembly.

In some embodiments, the LED board has a top surface and an opposed bottom surface separated by a thermally conductive layer, the LED board comprising at least one LED on the top surface and thermally coupled to the thermally conductive layer. In some embodiments, alone or in combination with any one of the previous aspects, the method further comprises thermally insulating at least a portion of the bottom surface of the LED board to contain the heat to the thermally conductive layer.

In some embodiments, alone or in combination with any one of the previous aspects, the LED board has a top surface and an opposed bottom surface separated by a conductive layer, the LED board comprising the at least one LED on the top surface and thermally coupled to the conductive layer at least a portion of the bottom surface is thermally insulated, wherein the bottom surface comprises a bottom periphery portion not thermally insulated and is thermally coupled to the thermally conductive layer and the heat sink assembly. In some aspects, only the bottom periphery portion is thermally coupled to the heat sink assembly. In other aspects, only the bottom periphery portion is thermally coupled directly to the heat sink assembly.

In some embodiments, alone or in combination with any one of the previous aspects, the LED board has a top surface and an opposed bottom surface separated by a conductive layer, the LED board comprising the at least one LED on the top surface and thermally coupled to the conductive layer at least a portion of the bottom surface is thermally insulated, and wherein the top surface comprises a top periphery portion is thermally coupled to the heat sink assembly. In some aspects, only the top periphery portion is thermally coupled to the heat sink assembly. In other aspects, only the top periphery portion is thermally coupled directly to the heat sink assembly.

In some embodiments, alone or in combination with any one of the previous aspects, the LED board is substantially planar. In some embodiments, alone or in combination with any one of the previous aspects, the LED board has an odd number of thermally conductive peripheral edges. In some embodiments, alone or in combination with any one of the previous aspects, the LED board is substantially triangular shaped or is substantially circular shaped. In some embodiments, alone or in combination with any one of the previous aspects, the LED board is a metal core PCB having a metal-exposed periphery.

In some embodiments, alone or in combination with any one of the previous aspects, the LED lamp further comprises a base having an electrical outlet and an open end separated from the base by an interior space, the heat sink assembly comprises a portion extending into at least a portion of the interior space of the base.

In some embodiments, alone or in combination with any one of the previous aspects, the heat sink assembly is cup shaped. In some embodiments, alone or in combination with any one of the previous aspects, a portion of the heat sink assembly is insert molded with the base. In some embodiments, alone or in combination with any one of the previous aspects, the LED board is configured for compression or swage fit to the base. In some embodiments, alone or in combination with any one of the previous aspects, at least a portion of the base is of conductive plastic, the method further comprising transferring the heat to the base.

In some embodiments, alone or in combination with any one of the previous aspects, the method further comprises transferring the heat to an optically transmissive exterior enclosure extending from an open end of the base.

In some embodiments, a LED lighting fixture comprises: a metal core PCB LED board with a metal-exposed periphery, the metal core PCB LED board comprising at least one LED operable to emit light when energized through an electrical path from a base; and a heat sink assembly thermally coupled to the metal-exposed periphery.

In some embodiments, the LED board has a top surface and an opposed bottom surface separated by a conductive layer, the LED board comprising the at least one LED on the top surface and thermally coupled to the conductive layer at least a portion of the bottom surface is thermally insulated, wherein the bottom surface comprises a bottom periphery portion not thermally insulated and is thermally coupled to the thermally conductive layer and the heat sink assembly. In some aspects, only the bottom periphery portion is thermally coupled to the heat sink assembly. In other aspects, only the bottom periphery portion is thermally coupled directly to the heat sink assembly.

In some embodiments, alone or in combination with any one of the previous aspects, the LED board has a top surface and an opposed bottom surface separated by a conductive layer, the LED board comprising the at least one LED on the top surface and thermally coupled to the conductive layer at least a portion of the bottom surface is thermally insulated, wherein the top surface comprises a top periphery portion thermally coupled to the heat sink assembly. In some aspects, only the top periphery portion is thermally coupled to the heat sink assembly. In other aspects, only the top periphery portion is thermally coupled directly to the heat sink assembly.

In some embodiments, alone or in combination with any one of the previous aspects, the metal core PCB LED board is configured for compression or swage fit to the base.

In some embodiments, alone or in combination with any one of the previous aspects, the LED lighting fixture further comprising an optically transmissive exterior enclosure extending from the open end of the base.

DETAILED DESCRIPTION

Figure 1A:
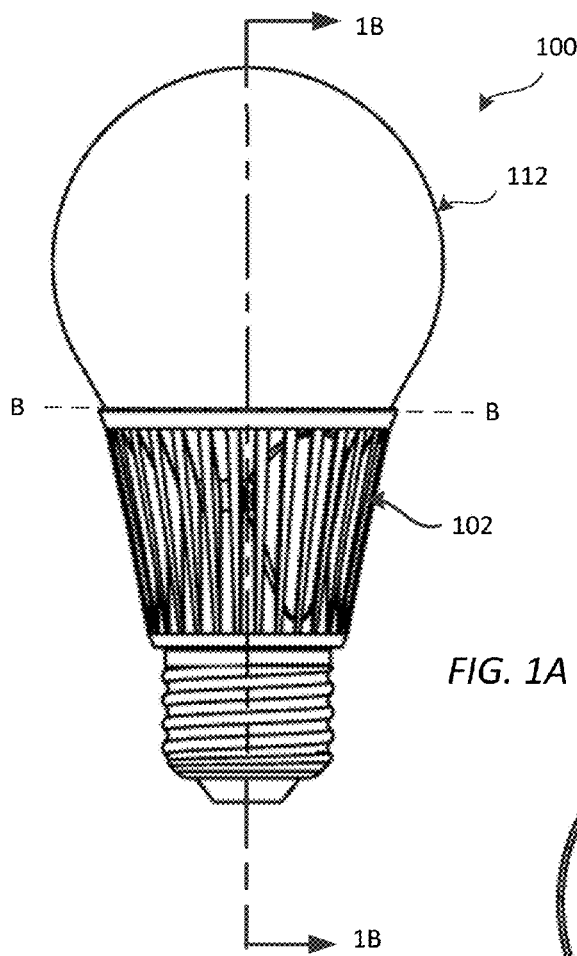
FIG. 1A is a front plan view of an embodiment of a LED fixture of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Multiple LEDs can be used together, forming an LED array. The LEDs can be mounted on or fixed within the lamp in various ways. In at least some example embodiments, a Led board is used. The term "lamp" is meant to encompass not only a solid-state replacement for a traditional incandescent and fluorescent bulbs as illustrated herein, but also non-traditional lamps and complete light fixtures.

In some embodiments, a LED lamp comprises a base having an electrical connector. The term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture. At least one LED is operable to emit light when energized through an electrical path from the base. A LED board is in the electrical path and supports the at least one LED. The LED board may be mounted on a heat sink or its assembly components. The LED board may be mounted directly on the heat sink or its assembly components, including a heat spreader plate. The LED board is configured with one or more apertures for receiving an electrical interconnect. A lamp electronics board is in the electrical path and is electrically coupled to the base. The electrical interconnect extends through the aperture and comprises an electrical conductor connecting the LED board to the lamp electronics board. The electrical interconnect may extend through a second aperture in the heat sink. A snap-fit connector may connect the electrical interconnect to the heat sink. The heat sink or its assembly components may separate the LED board from the base. In some embodiments, the LED assembly 130 can be crimp fit around the heat sink assembly 149.

For example, in some embodiments the electrical interconnect may comprise a locking member. The locking member can be a deformable locking member for snap-fit assembly. The heat sink may be trapped between the deformable locking member and a stop. The electrical conductor may comprise a first contact that is resiliently deformed into engagement with the LED board where the first contact may be covered by a cover 210. The lamp electronics board may be substantially orthogonal to the LED board. The lamp electronics board may be at least partially located in the base. The electrical interconnect may comprise a second electrical conductor resiliently deformed into engagement with the lamp electronics board. The second electrical conductor may be resiliently deformed into engagement with the LED board. The electrical conductor may be of a design configured to be resiliently deformed into engagement with the LED board as disclosed and described in co-assigned U.S. provisional application No. 62/130,680, filed Mar. 10, 2015, the contents of which are incorporated by reference in its entirety.

Lamp 100 may be used as an A-series lamp, more particularly; lamp 100 is designed to serve as a solid-state replacement for an A19 incandescent bulb or similar bulbs. In one embodiment, the enclosure 112 and base 102 are dimensioned to be a replacement for an ANSI standard A19 bulb such that the dimensions of the lamp 100 fall within the ANSI standards for an A19 bulb. The dimensions may be different for other ANSI standards including, but not limited to, A21 and A23 standards.

Figure 1B:
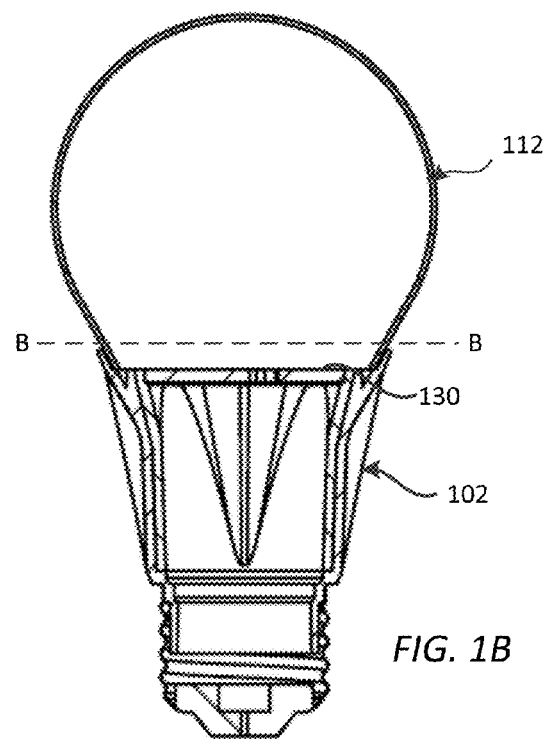
FIG. 1B is a section view along section line 1B-1B of the embodiment of FIG. 1A.
Figure 1C:
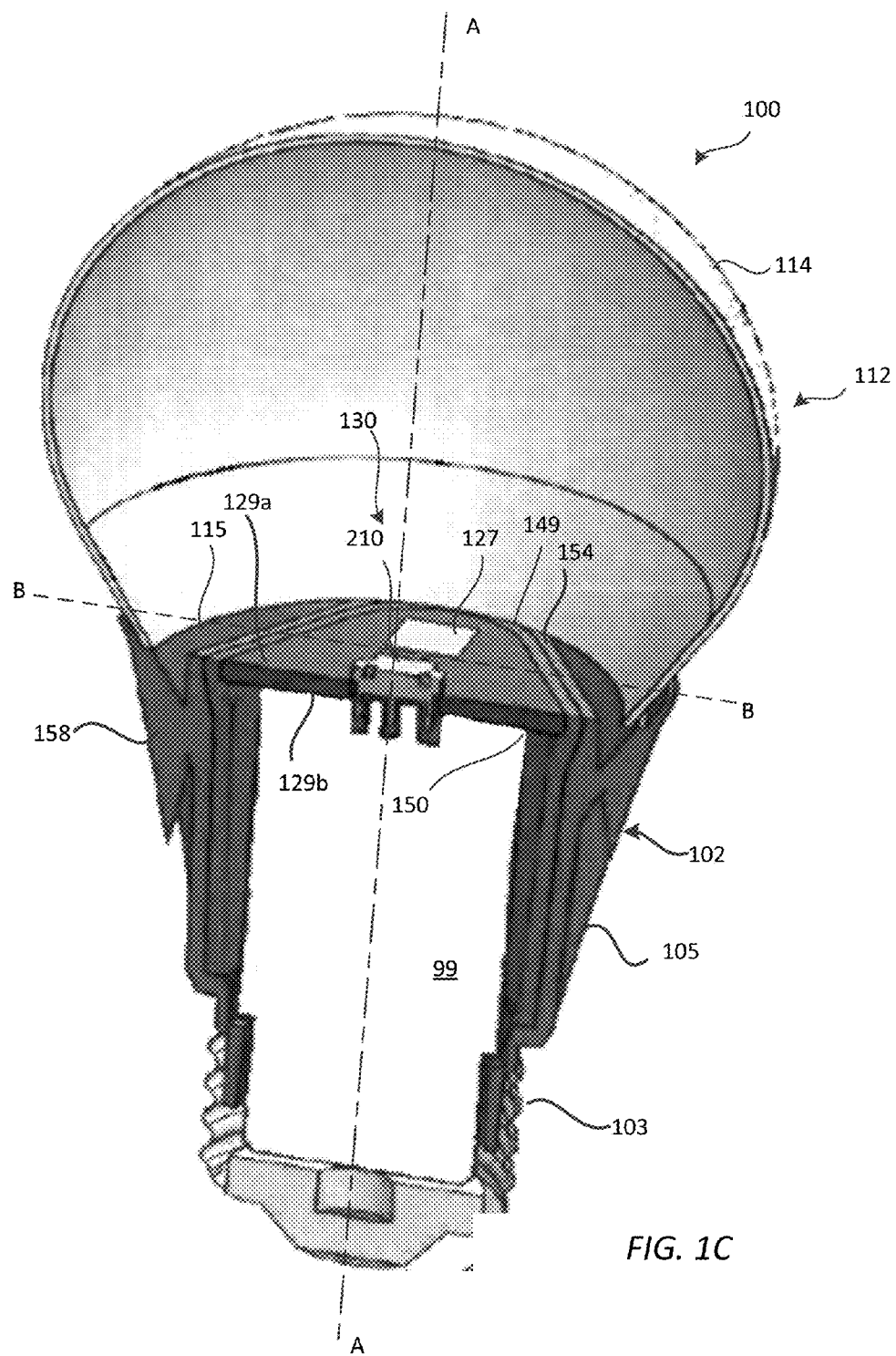
FIG. 1C is a perspective sectional view the fixture of FIG. 1A.
Figure 2:
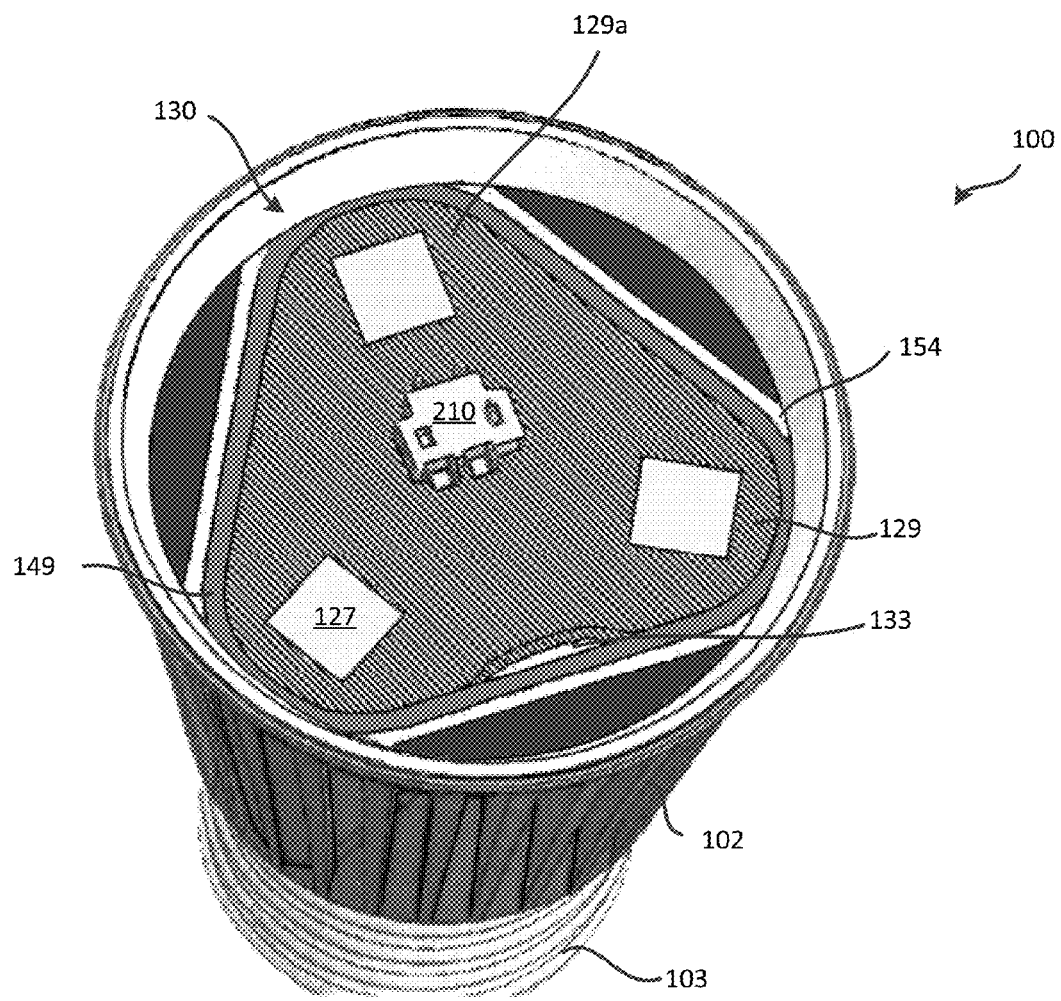
FIG. 2 is a top perspective view of the fixture of FIG. 1A without its enclosure.
Figure 3:
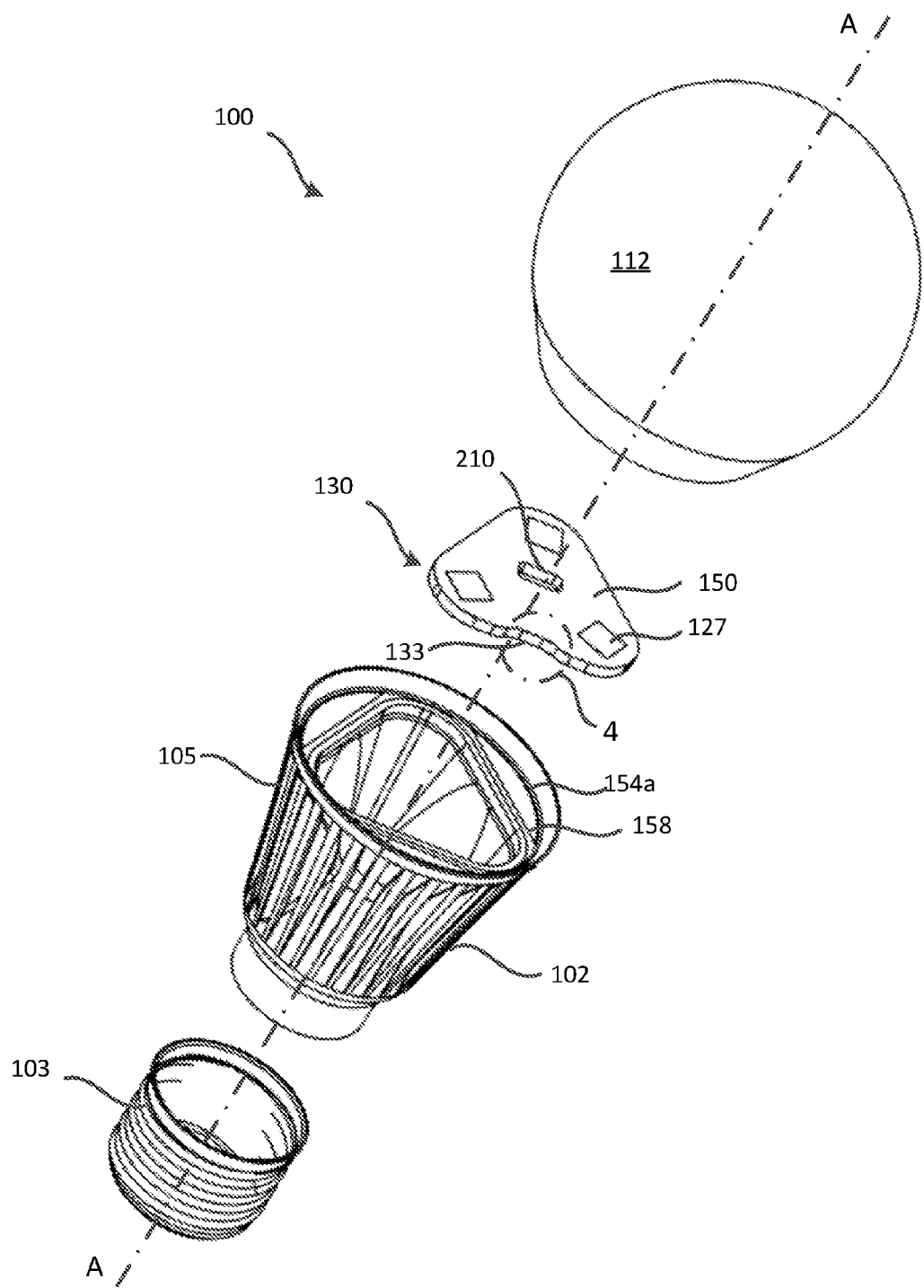
FIG. 3 is an exploded view of the fixture of FIG. 1A.

In some embodiments, a substantially flat LED board 129 with top surface 129a and opposing bottom surface 129b thermally coupled to heat sink assembly 149 and first portion 154, as shown with respect to lamp 100 of FIGS. 1C and 2. FIGS. 1-3 show LED assembly 130 comprises LED board 129 shown as planar and extending transversely to the longitudinal axis A-A and parallel to line B-B of the lamp. In some embodiments, the LEDs 127 are be arranged on the LED board to emit light primarily upwardly. In some embodiments the LED assembly 130 and LEDs 127 may be disposed flush or below the neck 115 of the enclosure 112 as shown in FIG. 1C rather than extending into the enclosure Opening 133 in LED board 129 may provide air flow from interior 99 and/or ambient through lamp into enclosure during use as well as or providing for means of disassembly. Additional components, such as ESDs, wires, via holes, contacts, coatings, etc., may be present in the LED assembly 130 or on the LED board 129 and its surfaces.

In some embodiments, the LED board 129 is supported on a flat transverse support surface 129a that extends transversely to the longitudinal axis of the lamp and is thermally coupled to heat sink assembly 149, e.g., via the first portion 154. The LEDs 127 may be mounted on the exposed surface of the LED board 129 and may emit light in a variety of patterns. The LED board 129 can be a metal core PCB with one or more of its perimeter edges functioning as the LED mounting portion 150 and being thermally coupled to the first portion 154 of the heat assembly as described above. FIGS. 3-4C depicts a metal core PCB LED assembly 130 having three edges, thus optimizing the usage of the panel. Other metal core PCB arrangements can be used, such as rectangular, square, pentagonal, and circular or oval.

The LEDs 127 may comprise an LED die disposed in an encapsulant such as silicone, and LEDs may be encapsulated with a phosphor and/or notch filter material to provide local wavelength conversion or wavelength filtering, as will be described later when various options for creating white light are discussed. A wide variety of LEDs and combinations of LEDs may be used. In at least some example embodiments, the LEDs are mounted on a LED board 129 to create a LED assembly 130 and are operable to emit light when energized through an electrical path from the base 102. In the present disclosure the term "LED board" is used to refer to the electronics board that supports the individual LEDs or LED packages and includes or supports electrical conductors that form part of the electrical path to deliver current to the LEDs. The term LED board may also include a submount on which the electronics board is mounted.

An at least partially optically transmissive enclosure 112 is mounted to the base 102 for emitting light. The enclosure 112 may be connected to the base 102 by any suitable connection mechanism including adhesive, mechanical connectors, friction fit, separate fasteners or the like or combinations of such connection mechanisms. In some embodiments, the enclosure 112 may be made of glass, quartz, borosilicate, silicate, polycarbonate, other plastic or other suitable optically transmissive material. The enclosure 112 may be of similar shape to that commonly used in household incandescent bulbs. In some embodiments, the glass enclosure is coated on the inside with silica, providing a diffuse scattering layer that produces a more uniform far field pattern. The enclosure 112 may also be etched, frosted or coated. Alternatively, the surface treatment may be omitted and a clear enclosure may be provided.

The enclosure 112 may also be provided with a shatter proof or shatter resistant coating. It should also be noted that in this or any of the embodiments shown here, the optically transmissive enclosure 112 or a portion of the optically transmissive enclosure 112 could be coated or impregnated with phosphor or a diffuser. In an A19 style lamp, or in other bulbs having similar form factors, the enclosure 112 may have a traditional bulb shape having a globe shaped enclosure surface 114 that tapers to a narrower neck 115 and joins with base 105. In these embodiments, the enclosure may be entirely optically transmissive. In a lamp such as shown the light is emitted in an omnidirectional pattern and may be compliant with Energy Star® requirements for omnidirectional lamps. In some embodiments, components of the heat sink assembly are positioned in the enclosure so as to spread and/or direct heat from the LEDs away from the power supply and the base.

The lamp of the disclosure may comprise a base 102 comprising an electrical connector 103, such as an Edison screw, and a housing 105 connected to the Edison screw. The lamp base 102, such as an Edison base, functions as the electrical and physical connector to connect the lamp 100 to an electrical socket or other connector. Depending on the embodiment, other base configurations are possible to make the electrical connection such as other standard bases or non-traditional bases. The Edison screw 103 may be connected to the housing 105 by adhesive, mechanical connector, welding, separate fasteners, soldered wires, or the like. The material of the housing 105 may comprise a thermally conductive material such that the housing 105 may form part of the heat sink structure for dissipating heat from the lamp 100. The housing 105 and the Edison screw 103 define an internal cavity 99 for receiving the electronics of the lamp. The lamp electronics may be mounted on a lamp electronics board. The lamp electronics board is electrically coupled to the Edison screw 103 such that an electrical connection may be made from the Edison screw 103 to the lamp electronics on lamp electronics board. The base 102 may be potted to physically and electrically isolate and protect the lamp electronics.

The LEDs 127 are mounted on a LED board 129 to create a LED assembly 130 and are operable to emit light when energized through an electrical connection from the base 102. In some embodiments, the LED board 129 may be made of a thermally conductive material. Because in some embodiments the LED board 129 is pliable and the LED placement on the substrate may be varied, the LED board may be formed and bent into a variety of configurations. The orientation of the LEDs and the number of LEDs may be varied to create a desired light pattern. In other embodiments, the LED board may be manufactured in the desired shape.

An electrical path runs between the LED board 129 and the lamp base 102 to carry both sides of the supply to provide critical current to the LEDs 127. In some embodiments, the LED board 129 is a generally planar member disposed transversely to the longitudinal axis of the lamp. The LEDs 127 may be disposed about an outwardly facing surface of the LED assembly such that light is projected generally outward. A cover 210 can be used to couple the LED board 129 and LED 127 to the electronics.

In some embodiments, the lamp electronics such as a driver and/or power supply are included on the LED board 129. In other embodiments, the driver and/or power supply are included in the base 102 on the lamp electronics board (not shown). The power supply and drivers (not shown) may also be mounted separately where components of the power supply are mounted in the base 102 and the driver is mounted with the LED board 129 in the enclosure 112. In some embodiments, the lamp electronics including a power supply and/or driver are mounted on a lamp electronics board (not shown) where the board is supported in the base and is in the electrical path from the base to the LEDs.

The lamp electronics board may be electrically coupled by any suitable electrical connection to the electrical connector 103 of the base 102 such as by a soldered connection, wires or ribbons or direct contact between board contacts and the electrical connector 103. In some embodiments, the lamp electronics board may be mounted to extend vertically such that the lamp electronics board extends along or parallel to the longitudinal axis of the lamp. The lamp electronics board may be disposed at a substantially right angle to the transverse portion of the LED board 129. The lamp electronics board may typically be mounted inside of the base 102 and may be isolated from the internal space of the enclosure 112 by a heat sink assembly 149 or other structure or structures.

Heat sink assembly 149 can comprise a first portion 154 for thermally coupling with the LED board 129 as discussed below, as well as heat dissipation portions (e.g., members 158). The LED board 129 may typically be mounted inside of the space of the enclosure 112 such that the LEDs 127 supported by the LED board 129 are positioned to emit light from the enclosure. Thus, the lamp electronics board and the LED board 129 may be disposed on opposite sides of a heat sink and/or other structures. An electrical connection can be made between the lamp electronics board and the LED board 129 to complete the electrical path from the base to the LEDs 127.

In some embodiments, the heat sink assembly 149 comprises a LED mounting portion 150. In some embodiments, the LED mounting portion 150 is comprised of separate or contiguous components configured to thermally engage with each other upon assembly.

As shown in FIGS. 1-3, the heat sink assembly 149 and the LED mounting portion 150 are separate components configured to thermally engage with each other. The LED mounting portion 150 can be insert molded with the material forming the base 102. A portion 154 of the heat sink assembly 149 can be insert molded with the material forming the base 102 such that the portion surrounds the electronics positioned within interior 99 of the base 102. In this configuration, the heat sink assembly 149 and the LED assembly 130 can be configured as a "cup and cap" where the heat sink assembly 149 at least partially surrounds a portion of the LED assembly 130 such that the periphery of the LED assembly is thermally coupled to the heat sink assembly. In some embodiments, the heat sink assembly 149 is thermally coupled only with the LED assembly 130 peripheral. In some embodiments, the heat sink assembly 149 is thermally coupled with the LED assembly 130 peripheral edge. In some embodiments, the heat sink assembly 149 is thermally coupled only with the LED assembly 130 peripheral edge. Apertures can be provided through the LED assembly 130 for electrical connection in this configuration are separate components configured to thermally engage with each other.

The heat sink assembly 149 or the LED mounting portion 150 for the LED board 129, may have a variety of configurations. The heat sink assembly components may be made of metal such as aluminum or zinc or thermal plastic or other suitable thermally conductive material. In one embodiment, a plurality of heat dissipating members 158 may be formed on the exposed portions of the housing 105 and/or the enclosure 112 to facilitate the heat transfer to the ambient environment. In one embodiment, the heat dissipating members 158 comprise a plurality fins that extend outwardly to increase the surface area of the heat sink.

The heat sink assembly 149 comprises a first portion 154 that is thermally coupled with the LED assembly 130 such that heat is conducted away from the LED assembly 130 by the first portion 154. The first portion 154 is coupled to the housing 105 and/or to the enclosure 112. In one embodiment, the first portion 154 and housing 105 are formed as two pieces where the first portion 152 fits into the base housing such that the first portion separates the interior space of the enclosure 114 from the interior space 99 of the base 102. One or more apertures (not shown) can be formed in the first portion 154 that communicates the interior space of enclosure 112 with the interior space 99 of the base 102, or the interior space of the base can be isolated from the interior space of the enclosure.

As shown in FIG. 3, in one embodiment, the heat sink assembly 149 may comprise a lip portion 154a mated with or integral with the base 102 and may conform to the interior shape of the housing 105. In some embodiments, the heat sink assembly 149 is thermally coupled with the LED assembly 130 periphery via the lip portion 154a such that heat is conducted away from the LED assembly 130. In some embodiments, the heat sink assembly 149 is thermally coupled only with the LED assembly 130 periphery via the lip portion 154a. In some embodiments, the heat sink assembly 149 is thermally coupled with the LED assembly 130 peripheral edge via the lip portion 154a such that heat is conducted away from the LED assembly 130. In some embodiments, the heat sink assembly 149 is thermally coupled only with the LED assembly 130 peripheral edge via the lip portion 154a.

As shown in FIGS. 1-3, a lateral line of separation (as indicated by line B-B) of the interior space 99 of the base and the LED board with that of the interior of enclosure 112 is created upon construction of the LED lamp. In some embodiments, the LEDs are configured and arranged to emit omni-directionally above the lateral line of separation B-B with little or no obstruction from the LED lamp components. Such LEDs can be rectangular, square, prism, or frustoconical shaped and project from the surface of the LED board.

In some embodiments, the LEDs are positioned and arranged above the lateral line B-B of separation and emit omni-directionally with little or no obstruction from the LED lamp components. In some embodiments, the LEDs are positioned and arranged above and below the lateral line of separation B-B and emit omni-directionally with little or no obstruction from the LED lamp components. In other embodiments, the LEDs are positioned and arranged below the lateral line of separation B-B and emit omni-directionally with little or no obstruction from the LED lamp components. Configurations of the LED lamp, such as the enclosure and/or reflective components can be used or combined with the position and arrangement of LEDs above and/or below the lateral line of separation B-B to provide the omni-directionality of the light produced from the LEDs.

In some embodiments the housing 105 or the base 102 may be made of thermal plastic such that heat may be conducted from the first portion 154 to the ambient environment via the housing 105, which may be of a thermal plastic or an engineering plastic or resin and/or a thermally conductive plastic or resin such that the base or housing 105 forms part of heat sink assembly 149. In some embodiments, a portion of the heat sink assembly is insert molded with the a thermal plastic or an engineering plastic or resin and/or a thermally conductive plastic or resin. An opening 133 can be formed in the top surface 129a of the LED board 129 that communicates the interior space of enclosure 112 with the interior space 99 of the base 102.

Thermally conductive plastics (thermoplastics or thermosets) are generally not direct drop-in replacements for metals for heat management, but because of the conductive and convective heat flow pathways in such LED devices, nonetheless offer design improvement and allow replacement of metal with lighter weight material. In the present LED lamp configuration, in one aspect, conductivity-based heat management of the LED lamp may not be the limiting factor, and therefore, while metal may be the preferred material, it is not necessary. Thus, in the present application, where convection-based heat management is a limiting factor, thermally conductive plastics are used.

Moreover, thermally conductive plastics may provide a lower coefficient of thermal expansion (CTE) than metal, such as aluminum, as a heat sink source and can thereby reduce stresses due to differential expansion, as the thermally conductive plastics may more closely match the CTE of the LED element's construction (e.g., silicon, silicon carbide, sapphire or ceramics) that the thermally conductive plastic is in contact with. Most conductive plastics weigh 20-40% less than aluminum.

Examples of heat-conductive additives used in thermal conductive plastics are graphite carbon fibers and ceramics such as aluminum nitride and boron nitride. Graphite fibers conduct electricity as well as heat, whereas, ceramic additives are electrically insulative. Thermally conductive compounds may be compounded, combined or formulated with crystalline engineering resins such as polyamide, polyethersulphones, polysulphones, poly acetals, polycarbonates, polyether(ether)ketones, polyoxymethylene oxide, polyphenylene sulfide, polyphenylene oxide, liquid crystal polymers, and teflon due to their high heat resistance and lower melt viscosities, but amorphous resins or variants of the above can also be used.

In one aspect, the thermally conductive plastic used will have thermal conductivity of between about 1 W/mK to about 100 W/mK. In another example, boron nitride in combination with a thermal conductive plastic is used so as to provide thermal conductivity values of about 60-80 W/mK. In yet another example, aluminum nitride powder in combination with a thermal conductive plastic is used so as to provide thermal conductivity value of up to about 300 W/mK.

The LED lamp of the present disclosure may be configured as a directional lamp such as a PAR-style lamp or a BR-style lamp or flashlight. In other embodiments, the LED lamp can have any shape, including standard and non-standard shapes.

In a PAR or BR type lamp the light is emitted in a directional pattern. Standard PAR bulbs are reflector bulbs that reflect light in a direction where the beam angle is tightly controlled using a parabolic reflector. PAR lamps may direct the light in a pattern having a tightly controlled beam angle such as, but not limited to, 10°, 25° and 40°. BR lamps have a directional light pattern where the beam angle is generally speaking less tightly controlled than in a PAR lamp.

The LED lamp of the present disclosure may be used as a solid state replacement for a PAR or BR bulb. Where the lamp is intended to be used as a replacement for a PAR type lamp, the reflector may reflect the light in a tightly controlled beam angle and the reflective surface may comprise a parabolic surface such that light reflecting off of the reflector is emitted from the lamp generally along the axis of the lamp to create a beam with a controlled beam angle. For a BR lamp the reflector may have a variety of configurations. In some embodiments the some or all of the heat sink assembly is coated with a light reflective material, or is constructed of a reflective material.

The LED lamp of the present disclosure may be a directional lamp such as a PAR or BR style lamp. For example, the enclosure may be secured to or be formed as part of the base 102. In some embodiments, a reflective surface may be positioned inside of the enclosure 112 such that it reflects some of the light generated by the LED 127. In other embodiments the enclosure 112 may be made of a optically transparent or non-transparent material and an interior surface of the enclosure 112 may be highly reflective such as by polishing the interior surface or by coating the interior surface of housing with aluminum or other highly reflective material. The enclosure 112 comprises an optically transmissive exit surface at the top of the enclosure, through which the light exits the lamp. The exit surface may be frosted or otherwise treated with a light diffuser and/or notch filter material.

In some embodiments, the LED lamp of the present disclosure is configured with a LED mounting portion 150 of the base 102 such that the LED mounting portion 150 supports the LED board 129 and separates it from the interior space 99 of the base and/or the interior of enclosure 112 coplanar with a plane consisting of the LED surface 129a and the neck 115 of the enclosure 112.

As shown in FIG. 1C, the LED mounting portion 150 extends from the open end or perimeter of the base 102 such that the LED mounting portion 150 isolates a portion of the bottom surface 129b of the LED board from the heat sink and urges heat to the periphery for dissipation to the heat sink and/or ambient or the interior space 99 of base 105. In some embodiments, the heat sink assembly 149 is thermally coupled with the LED assembly 130 peripheral edge. In some embodiments, the heat sink assembly 149 is thermally coupled only with the LED assembly 130 peripheral edge.

An electrical interconnect may be provided for electrically coupling the LED board 129 to the lamp electronics board. The electrical interconnect may comprise conductors for electrically coupling the lamp electronics board to the LED board 129.

In many applications, including LED lamps, it is necessary to mount electronics boards such as a printed wiring board (PWB), printed circuit board (PCB), lead frame structure, metal core board, metal core printed circuit board, FR4 PCBs, extruded submounts, hybrid combinations of such structures, or other similar structures or combinations of such structures. The term "board" as used herein means an electronics board for mounting electronic components ("electronics" as used herein) such as LEDs, drivers, power supplies and/or the like including the types of electronics boards described above where at least a portion of the electrical path to the electrical components is supported on or forms part of the board. In many applications the mounting of such electronic boards may require the mounting and electrical coupling of multiple electronics boards that may be oriented in different planes. While the electrical interconnect of the disclosure is described with reference to an LED lamp, the interconnect may be used to mount combinations of electronics boards in other devices where the interconnect may be advantageously used.

Figure 4A:
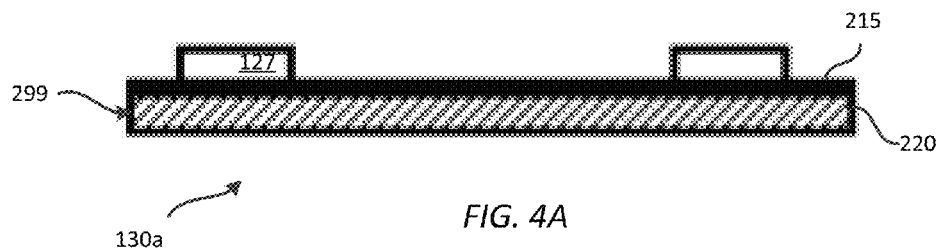
FIGS. 4A, 4B and 4C are section views of LED assembly embodiments of the fixture of FIG. 1A.
Figure 4B:
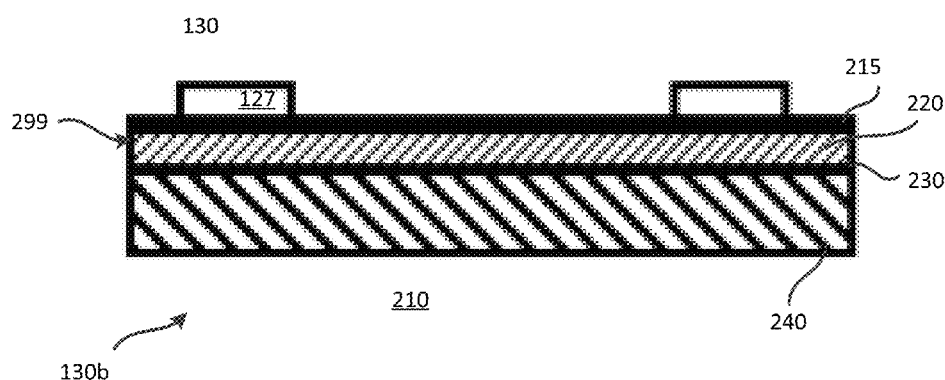
Figure 4C:
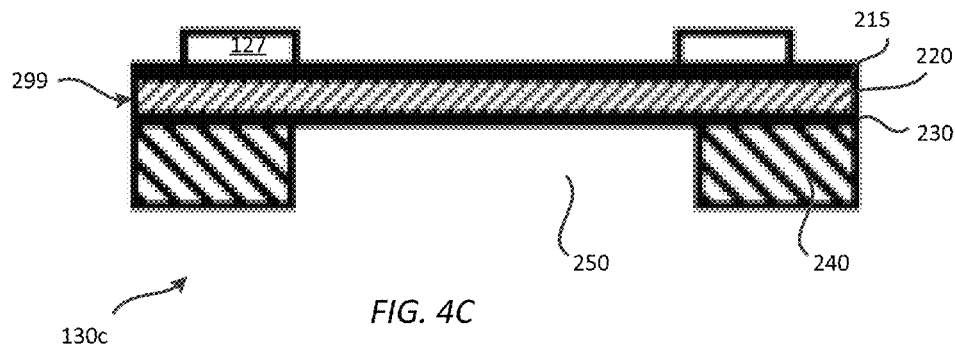

FIGS. 4A, 4B, and 4C depict sectional views of various embodiments of metal core PCB boards suitable practicing the present disclosure. With reference to callout 4 of FIG. 3, a single layer metal core PCB can be used. In other embodiments, a two-layer or four layer metal core PCB can be used. LED assembly 130a comprises LEDs 127 on surface 215 of thermal conductive layer 220 having thermally conductive periphery, hereinafter shown as periphery edge 299. Thus, LED assembly 130a comprises LEDs 127 on surface 215 of thermal conductive layer 220 having thermally conductive peripheral edge 299. Thermal conductive layer 220 can be a metal or a thermal conductive dielectric with a metal coating or metal web or frame. In some aspects, thermally conductive layer having peripheral edge 299 is sandwiched between dielectric material, that is, above and below the thermally conductive layer. The "edge" is typically horizontal to the longitudinal surface of the conductive layer and can be a continuous edge or discontinuous (e.g., as shown in FIG. 2 where opening 133 provides discontinuous contact with a portion of the heat sink assembly 149.

LED assembly 130b provides dielectric and/or thermal insulative layer 240 to facilitate heat transfer to the peripheral edge 299. Interface layer 230 can be metal and provide for via hole access from the surface 215 to provide electrical power. Other layers and constructs are possible on LED assembly 130a or 130b.

LED assembly 130c corresponds in part to the arrangement of planar LED assembly in FIG. 1C where layer 240 is replaced by first portion 154 in base 105, leaving air-gap 250 between the peripheral contacts of assembly 130c and portion 154 to facilitate heat transfer to the peripheral edge 299 and/or permit air-cooling.

Figure 5A:
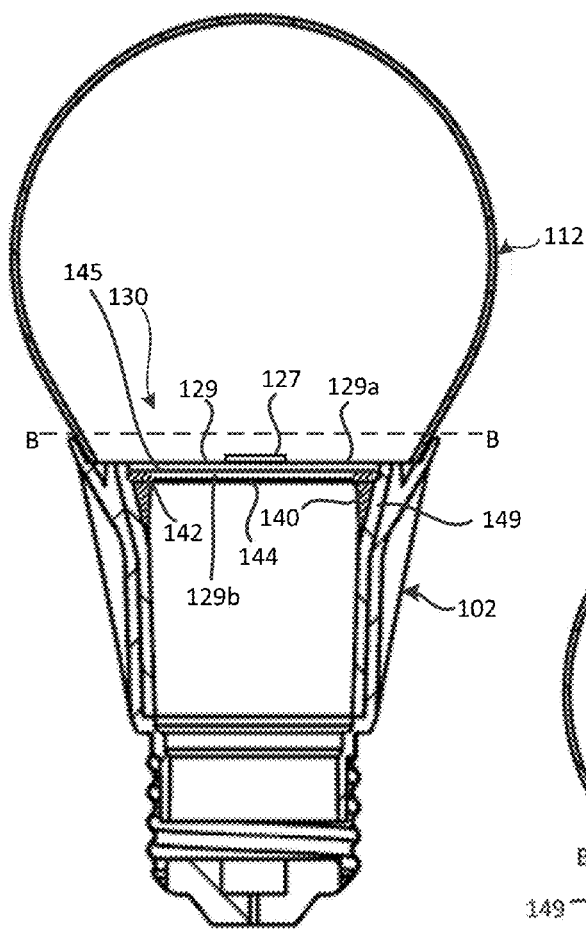
FIGS. 5A, 5B and 5C are section views of alternate LED assembly embodiments of the fixture of FIG. 1A.
Figure 5B:
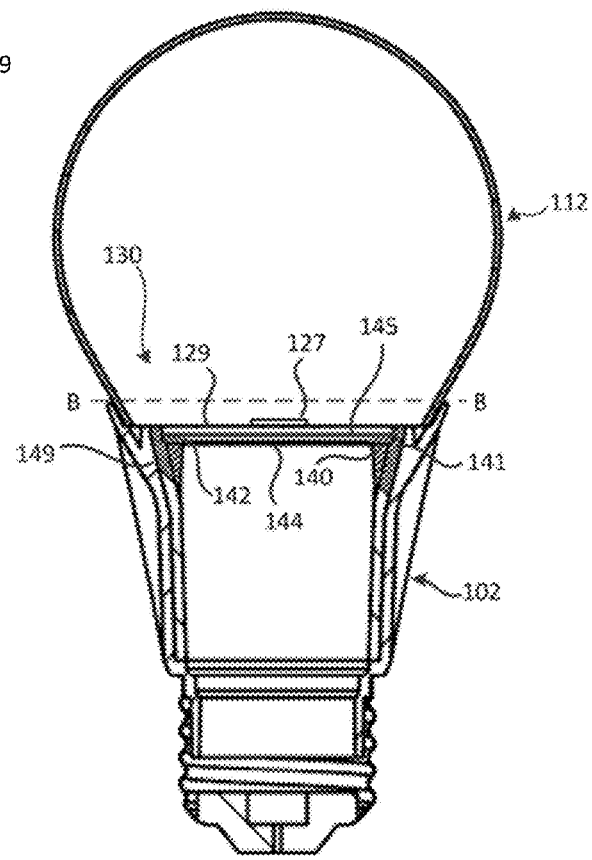

As shown in FIGS. 5A and 5B, section views of alternate LED assembly embodiments of the fixture of FIG. 1 provide heat management arrangement is provided where the LED assembly 130 has a LED board 129 comprising a top surface 129a and an opposed bottom surface 129b separated by a thermally conductive layer 145, at least one LED 127 on the top surface and thermally coupled to the thermally conductive layer 145, where at least a portion 144 of the bottom surface is optionally thermally insulated with material 140, and a bottom surface periphery portion 142 is not thermally insulated and is thermally coupled to the conductive layer and a portion 140, 141 of the heat sink assembly 149.

The thermally conductive layer 145 can be exposed about the periphery of the LED board 129, e.g., between the top surface 129a and bottom surface 129b. Exposed thermally conductive layer 145 can form a continuous or non-continuous "edge" about the periphery of the LED board 129. In this configuration, heat is managed via a primary contact with the periphery of the LED board 129, e.g., by the exposed side edge of the board 129 and/or with a secondary contact, e.g., along the periphery of the bottom surface 129b. In some embodiments, heat is managed only via a primary contact with the periphery of the LED board 129, e.g., by the exposed side edge of the board 129 and/or with a secondary contact, e.g., along the periphery of the bottom surface 129b. In some embodiments, heat is managed via a direct primary contact of the heat sink assembly 149 and the periphery of the LED board 129, e.g., by the exposed side edge of the board 129 and/or with a secondary contact, e.g., along the periphery of the bottom surface 129b. In some embodiments, only the bottom surface periphery portion 142 that is not thermally insulated is thermally coupled directly to the conductive layer and a portion 141, 142 of the heat sink assembly 149. In one aspect the conductive layer 145 is continuous. In one aspect the thermally conductive layer 145 is a metal foil, strip or netting. Thermally conductive layer 145 can be electrically conductive.

In some embodiments, the "periphery" can be between 1% to about 15% of the total surface area of the LED board, preferably between 1% to about 15% of the total surface area relative to the portion of that surface thermally contacting the heat sink assembly, e.g., the top or bottom surface area of the LED board relative to the portion thereof in thermal contact with the heat sink assembly. In some embodiments, the "periphery" can be between 1% to about 15% of the total surface area of the LED board. In some embodiments, the "periphery" can be between 1% to about 15% of the total surface area of the LED board, preferably between 1% to about 15% of the total surface area relative to the portion of that surface in direct thermal contact with the heat sink assembly.

In structural configurations where portions of both the top and bottom surfaces of the LED board periphery make thermal contact to the heat sink assembly, the periphery can be between 1% to about 15% of the total surface area of the LED board. Thus, the total surface area of the LED board relative to the percentage of surface area thermally contacting the heat sink assembly, e.g., the sum of the top and bottom surface area of the LED board relative the portion thereof in thermal contact with the heat sink assembly is not greater than 15% or is not greater than 20% of the total surface area of the LED board.

Figure 5C:
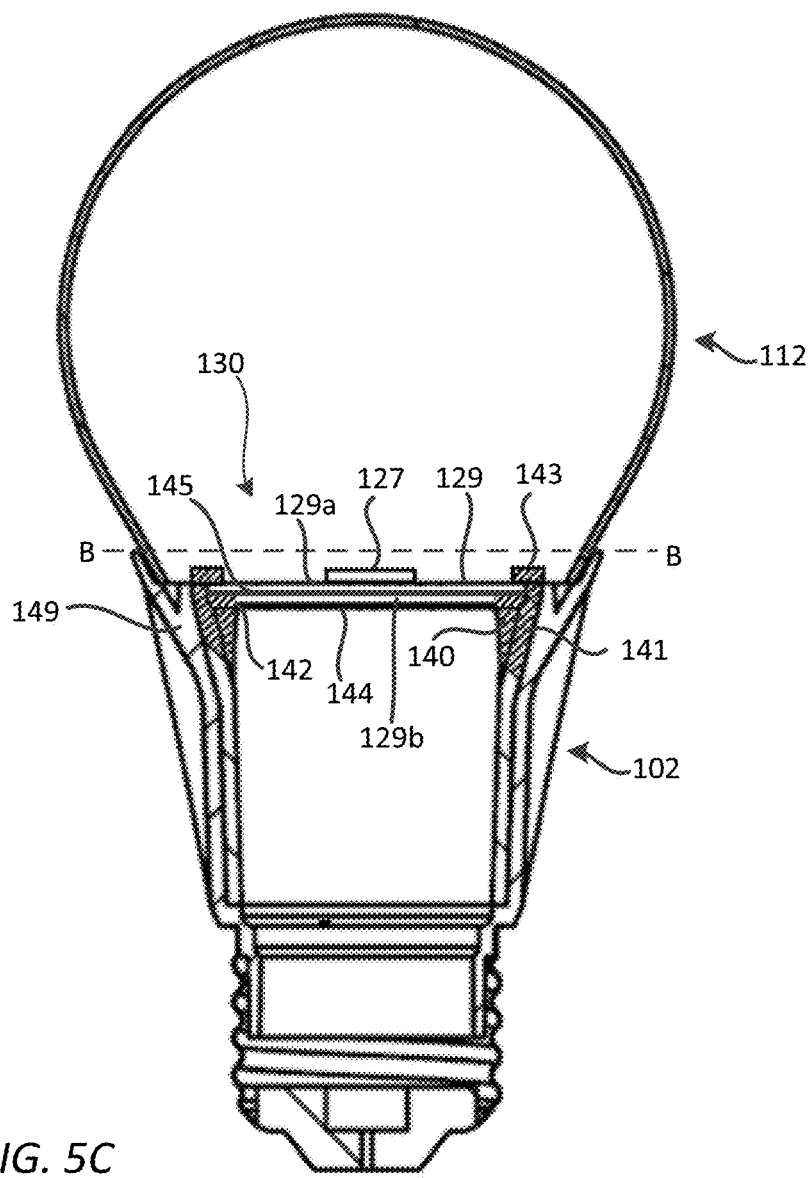

As shown in section view FIG. 5C, an alternative embodiment of the heat management arrangement is provided where the LED assembly 130 has a LED board 129 comprising a top surface 129a and an opposed bottom surface 129b separated by a conductive layer 145, at least one LED 127 on the top surface and thermally coupled to the conductive layer 145, where at least a portion 144 of the bottom surface is optionally thermally insulated with material 140, and a bottom surface periphery portion 142 is not thermally insulated and is thermally coupled to the conductive layer and a portion 141, 142 and or thermally conductive members 143, and that of the heat sink assembly 149. In this configuration, heat is managed via a primary contact with the periphery of the LED board 129, e.g., by the exposed side edge of the board 129 and/or with a secondary contact, e.g., along the periphery of the bottom surface 129b and/or top surface 129a. In some embodiments, heat is managed only via a primary contact with the periphery of the LED board 129, e.g., by the exposed side edge of the board 129 and/or with a secondary contact, e.g., along the periphery of the bottom surface 129*b* or the top surface 129*a*. In some embodiments, heat is managed only via a direct primary contact between the heat sink assembly 149 and the periphery of the LED board 129, e.g., by the exposed side edge of the board 129 and/or with a secondary contact, e.g., along the periphery of the bottom surface 129*b* or the top surface 129*a*. In some embodiments, thermally conductive members 143 can function to secure and/or index the LED board 129.

In any of the above embodiments, the base, heat sink and enclosure can be configured for snap-fit connection. Thus, the electrical interconnect can be fixed to the heat sink assembly 149 and connect the LED board 129 to the lamp electronics in a simple insertion operation without the need for any additional connection mechanisms, tools or assembly steps.

LEDs and/or LED packages used with embodiments of the disclosure can include light emitting diode chips that emit hues of light that, when mixed, are perceived in combination as white light. Phosphors can be used as described to add yet other colors of light by wavelength conversion. For example, blue or violet LEDs can be used in the LED assembly of the lamp and the appropriate phosphor can be in any of the ways mentioned above. LED devices can be used with phosphorized coatings packaged locally with the LEDs or with a phosphor coating the LED die as previously described. For example, blue-shifted yellow (BSY) LED devices, which typically include a local phosphor, can be used with a red phosphor on or in the optically transmissive enclosure or inner envelope to create substantially white light, or combined with red emitting LED devices in the array to create substantially white light.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Although specific embodiments have been shown and described herein, those of ordinary skill in the art appreciate that any arrangement, which is calculated to achieve the same purpose, may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

The invention claimed is:

1. An LED lighting fixture comprising:
a base comprising a heat sink assembly for dissipating heat to the ambient environment, a LED board supporting at least one LED operable to emit light when energized through an electrical path from the base, wherein the LED board comprises a top surface and an opposed, exposed bottom surface separated by a thermally conductive layer that forms an exposed thermally conductive periphery, the at least one LED being thermally coupled to the conductive layer such that heat is conducted from the at least one LED to the thermally conductive periphery; and
the thermally conductive periphery being in direct contact with the heat sink assembly such that the heat sink assembly is thermally coupled to the thermally conductive periphery and heat is dissipated from the LED board via the thermally conductive periphery, the exposed bottom surface being thermally insulated with material disposed on the exposed bottom surface adjacent the thermally conductive periphery such that an air gap is provided between the material disposed on the exposed bottom surface.

2. The LED lighting fixture of claim 1, wherein only the thermally conductive periphery of the LED board is thermally coupled to the heat sink assembly.

3. The LED lighting fixture of claim 1, wherein only the thermally conductive periphery of the LED board is directly coupled to the heat sink assembly.

4. The LED lighting fixture of claim 1, wherein the bottom surface comprises a bottom periphery portion that is not thermally insulated and that is thermally coupled to the conductive layer and the heat sink assembly.

5. The LED lighting fixture of claim 1, wherein the top surface comprises a top periphery portion that is thermally coupled to the conductive layer and the heat sink assembly.

6. The LED lighting fixture of claim 1, wherein the LED board is substantially planar.

7. The LED lighting fixture of claim 6, wherein the LED board has an odd number of peripheral edges.

8. The LED lighting fixture of claim 6, wherein the LED board is substantia triangular shaped or is substantially circular shaped.

9. The LED lighting fixture of claim 6, wherein the LED board is a metal core PCB with a metal-exposed peripheral edge.

10. The LED lighting fixture of claim 1, wherein the heat sink assembly comprises a portion extending into at least a portion of an interior space of the base.

11. The LED lighting fixture of claim 1, wherein the heat sink assembly is cup shaped.

12. The LED lighting fixture of claim 1, wherein a portion of the heat sink assembly is insert molded with the base.

13. The LED lighting fixture of claim 1, wherein the LED board is compression or swage fit to the base.

14. The LED lighting fixture of claim 1, wherein at a portion of the base is of conductive plastic.

15. The LED lighting fixture of claim 1, further comprising an optically transmissive exterior enclosure extending from the base.

16. The LED lighting fixture of claim 15, wherein at least a portion of the optically transmissive exterior enclosure is of conductive plastic.

17. The LED lighting fixture of claim 15, wherein the heat sink assembly comprises a portion extending into at least a portion of the optically transmissive exterior enclosure.

18. A method of heat management for a LED lighting fixture, the method comprising:
  thermally coupling a LED board to a heat sink assembly, where the LED board comprises a top surface and an opposed, exposed bottom surface separated by a thermally conductive layer that forms an exposed thermally conductive periphery;
  supporting at least one LED on the LED board such that the at least one LED is thermally coupled to the conductive layer, and heat is dissipated from the LED board to the heat sink assembly via the thermally conductive periphery, and
  thermally insulating the exposed bottom surface with material disposed on the exposed bottom surface adjacent the thermally conductive periphery such that an air gap is provided between the material disposed on the exposed bottom surface.

19. The method of claim 18, thermally coupling only the thermally conductive periphery portion to heat sink assembly.

20. The method of claim 18, thermally coupling only the thermally conductive periphery portion directly to the heat sink assembly.

21. The method of claim 18, wherein at least a portion of the top surface comprises a top periphery portion that is thermally coupled to the thermally conduct layer and the heat sink assembly.

22. The method of claim 18, wherein the LED board is substantially planar.

23. The method of claim 22, wherein the LED board is substantially triangular shaped or is substantially circular shaped.

24. The method of claim 22, wherein the LED board is a metal core PCB having a metal-exposed periphery.

25. The method of claim 18, wherein the LED board has an odd number of thermally conductive peripheral edges.

26. The method of claim 18, wherein the LED lamp further comprises a base having an electrical outlet and an open end separated from the base by an interior space, wherein the heat sink assembly comprises a portion extending into at least a portion of the interior space of the base.

27. The method of claim 18, wherein the heat sink assembly is cup shaped.

28. The method of claim 27, further insert molding a portion of the heat sink assembly with the base.

29. The method of claim 27, further compression or swage fitting the LED board to the base.

30. The method of claim 27, wherein at least a portion of the base is of conductive plastic, the method further comprising transferring the heat to the base.

31. The method of claim 27, further comprising transferring the heat to an optically transmissive exterior enclosure extending from the base.

32. A LED lighting fixture comprising:
  a base comprising a heat sink assembly for dissipating heat to the ambient environment,
  a metal core PCB LED board, the metal core PCB LED board supporting at least one LED operable to emit light when energized through an electrical path from the base, wherein the metal core PCB LED board comprises a top surface and an opposed, exposed bottom surface separated by a thermally conductive layer that forms an exposed thermally conductive metal periphery, the at least one LED being thermally coupled to the conductive layer
  such that heat is conducted from the at least one LED to the exposed thermally conductive metal periphery; and
  the thermally conductive metal periphery being in direct contact with the heat sink assembly such that the heat sink assembly is thermally coupled to the exposed thermally conductive metal periphery and heat is dissipated from the LED board via the thermally conductive periphery, the exposed bottom surface being thermally insulated with material disposed on the exposed bottom surface adjacent the thermally conductive periphery such that an air gap is provided between the material disposed on the bottom surface.

33. The LED lighting fixture of claim 32, wherein the bottom surface comprises a periphery portion that is not thermally insulated and is thermally coupled to the conductive layer and the heat sink assembly.

34. The LED lighting fixture of claim 33, wherein only the thermally conductive metal periphery is thermally coupled to the heat sink assembly.

35. The LED lighting fixture of claim 33, wherein only the thermally conductive metal periphery is thermally coupled directly to the heat sink assembly.

36. The LED lighting fixture of claim 32, wherein the top surface comprises a periphery portion that is thermally coupled to the conductive layer and the heat sink assembly.

37. The LED lighting fixture of claim 32, wherein the metal core PCB LED board is compression or swage fit to the base.

38. The LED lighting fixture of claim 32, further comprising an optically transmissive exterior enclosure extending from the base.

39. An LED lighting fixture comprising:
  a base comprising a heat sink assembly for dissipating heat to the ambient environment,
  a LED board comprising a thermally conductive periphery, a top surface and an opposed bottom surface separated by a conductive layer that forms an exposed thermally conductive periphery, the LED board supporting at least one LED on the top surface that is thermally coupled to the conductive layer, and
  such that heat is conducted from the at least one LED to the thermally conductive periphery, and wherein the top surface comprises a top periphery portion that forms part of the thermally conductive periphery, the thermally conductive periphery being in direct contact with the heat sink assembly such that the heat sink assembly is thermally coupled to the exposed thermally conductive periphery and heat is dissipated from the LED board via the thermally conductive periphery, the opposed bottom surface being thermally insulated with material disposed on the opposed bottom surface adjacent the thermally conductive periphery such that an air gap is provided between the material disposed on the opposed bottom surface,
  the at least one LED operable to emit light when energized through an electrical path from the base.

* * * * *

UNITED STATES PATENT AND TRADEMARK OFFICE
CERTIFICATE OF CORRECTION

PATENT NO. : 9,890,940 B2  
APPLICATION NO. : 14/725936  
DATED : February 13, 2018  
INVENTOR(S) : Bart P. Reier et al.

Page 1 of 1

It is certified that error appears in the above-identified patent and that said Letters Patent is hereby corrected as shown below:

In the Claims

In Column 16, Claim 8, please change Line 42 to:
board is substantially triangular shaped or is substantially In Column 16, Claim 14, please change Line 56 to:
14. The LED lighting fixture of claim 1, wherein at least a In Column 17, Claim 21, please change Line 26 to:
thermally coupled to the thermally conductive layer and the Signed and Sealed this  
Third Day of April, 2018

Andrei Iancu  
*Director of the United States Patent and Trademark Office*